United States Patent
Yu et al.

(10) Patent No.: US 7,746,651 B2
(45) Date of Patent: Jun. 29, 2010

(54) HEAT SINK ASSEMBLY HAVING A CLIP

(75) Inventors: Jian-Ping Yu, Shenzhen (CN);
Dong-Yun Li, Shenzhen (CN); Wei Wu,
Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 310 days.

(21) Appl. No.: 11/831,932

(22) Filed: Jul. 31, 2007

(65) Prior Publication Data
US 2009/0034199 A1    Feb. 5, 2009

(51) Int. Cl.
*H05K 7/20* (2006.01)
*H01L 23/34* (2006.01)
*F28F 7/00* (2006.01)
*A47B 97/00* (2006.01)

(52) U.S. Cl. ............... 361/719; 361/709; 361/710; 257/718; 257/719; 165/80.3; 165/185; 24/458; 24/459; 24/520; 248/510

(58) Field of Classification Search ............ 361/704, 361/709–710, 718–719; 257/718–719; 165/80.2–80.3; 165/185; 24/458–459, 520; 248/510
See application file for complete search history.

(56) References Cited

U.S. PATENT DOCUMENTS

| | | | | |
|---|---|---|---|---|
| 5,818,695 A | * | 10/1998 | Olson | 361/719 |
| 5,973,921 A | * | 10/1999 | Lin | 361/695 |
| 7,055,589 B2 | * | 6/2006 | Lee et al. | 165/185 |
| 7,203,066 B2 | | 4/2007 | Lee et al. | |
| 2003/0106670 A1 | * | 6/2003 | Lee et al. | 165/80.3 |
| 2003/0192672 A1 | * | 10/2003 | Lee et al. | 165/80.3 |
| 2004/0228095 A1 | * | 11/2004 | Lee et al. | 361/704 |

* cited by examiner

*Primary Examiner*—Zachary M Pape
(74) *Attorney, Agent, or Firm*—Frank R. Niranjan

(57) ABSTRACT

A heat sink assembly includes a heat sink and a clip for mounting the heat sink to an electronic component of a printed circuit board. The heat sink includes a base and a plurality of fins extending from the base. The clip includes a pressing member and a pair of elongated arms formed on opposite ends of the pressing member. The pressing member has a lower portion protruding toward the base of the heat sink. A middle one of the fins extends upwardly through the pressing member in a manner such that the lower portion of the pressing member resiliently abuts against the heat sink. The two arms are located on opposite lateral sides of the heat sink and bent downwardly to engage with the printed circuit board so that the pressing member exerts a force on the heat sink toward the electronic component.

12 Claims, 5 Drawing Sheets

HEAT SINK ASSEMBLY HAVING A CLIP

BACKGROUND OF THE INVENTION

1. Field of the Invention

The present invention relates generally to a heat sink assembly, and more particularly to a heat sink assembly having a heat sink and a clip, wherein the clip can reliably secure the heat sink on an electronic device.

2. Description of Related Art

Advances in microelectronics technology have resulted in electronic devices which process signals and data at unprecedented high speeds. During operation of many contemporary electronic devices such as central processing units (CPUs), solid-state circuits, and light emitting diode (LED) display units, large amounts of heat are produced. This heat must be efficiently removed to prevent the system from becoming unstable or being damaged.

Typically, a heat sink assembly comprises a heat sink attached to an outer surface of the electronic device to facilitate removal of heat therefrom and a pair of clips. The clips are attached to two opposite sides of the heat sink to provide pressure for securing the heat sink on the electronic device. U.S. Pat. No. 7,203,066 shows an example of this kind of heat sink assembly. However, when one of the clips is deformed unexpectedly, the corresponding pressure provided by the clip is changed; a pressure difference is produced between two sides of the heat sink such that the heat sink is prone to be fixed slantwise to the electronic device, whereby the heat sink cannot intimately contact the electronic device, and the efficiency of heat dissipation is thus lowered.

An improved heat sink assembly which overcomes the above problems is desired.

SUMMARY OF THE INVENTION

A heat sink assembly includes a heat sink and a clip for mounting the heat sink to an electronic component of a printed circuit board. The heat sink includes a base and a plurality of fins extending from the base. The clip includes a pressing member and a pair of elongated arms formed on opposite ends of the pressing member. The pressing member has a lower portion protruding toward the base of the heat sink. A middle one of the fins extends upwardly through the pressing member in a manner such that the lower portion of the pressing member resiliently abuts against the heat sink. The two arms are located on opposite lateral sides of the heat sink and bent downwardly to engage with the printed circuit board so that the pressing member exerts a force on the heat sink toward the electronic component.

Other advantages and novel features will become more apparent from the following detailed description of preferred embodiments when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
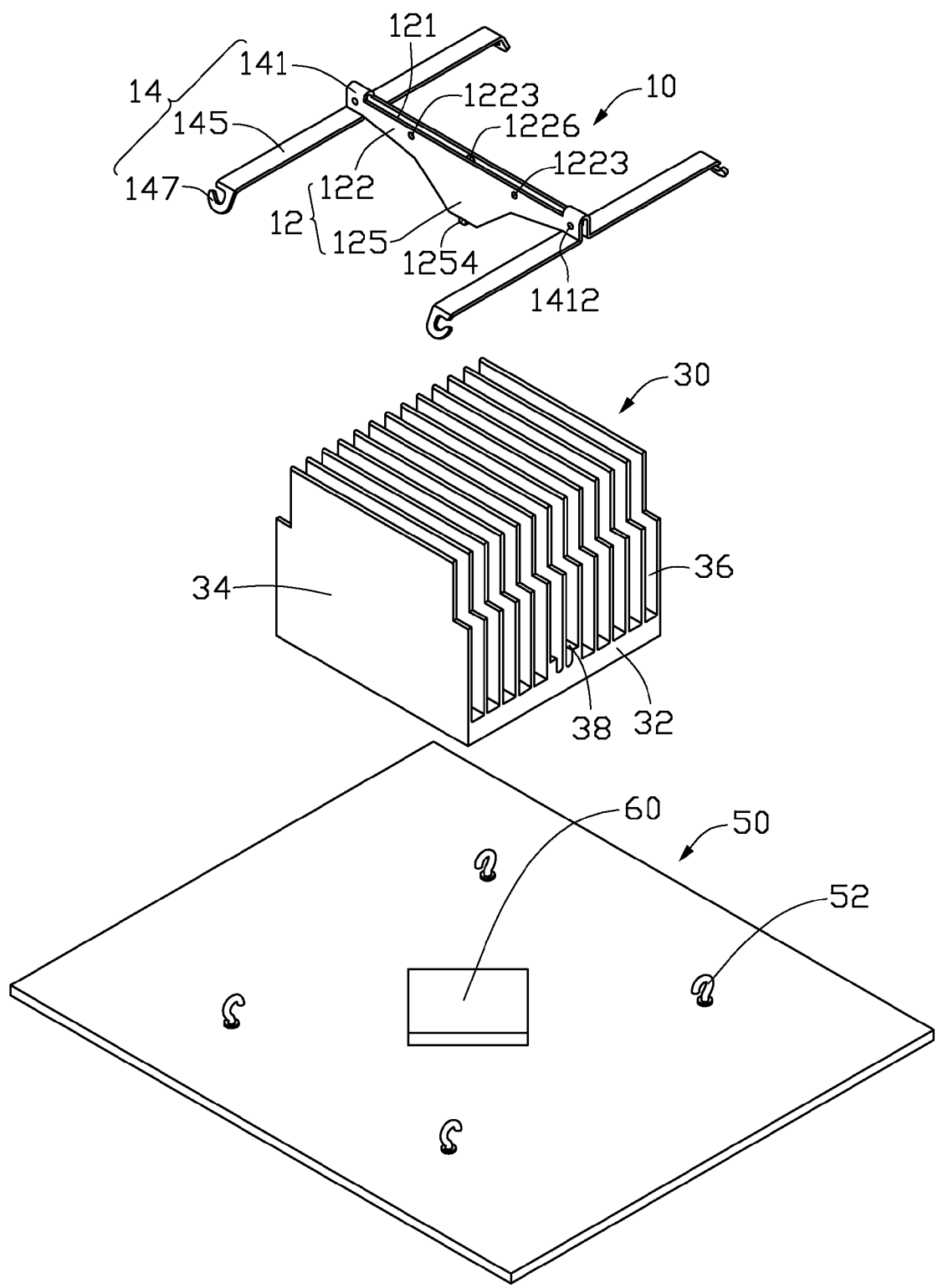
FIG. 1 is an exploded view of a heat sink assembly in accordance with a preferred embodiment of the present invention, together with a printed circuit board.

Referring to FIG. 1 a heat sink assembly in accordance with a preferred embodiment of the present invention is illustrated. The heat sink assembly is mounted on a printed circuit board 50 and used for dissipating heat generated by an electronic component 60 mounted on the printed circuit board 50. The heat sink assembly comprises a heat sink 30 and a clip 10. The printed circuit board 50 forms four clasps 52 around the electronic component 60. The clip 10 is attached to the heat sink 30 and cooperates with the clasps 52 of the printed circuit board 50 to mount the heat sink 30 on the electronic component 60.

The heat sink 30 has a base 32 with a bottom face thermally contacting with the electronic component 60, and a plurality of parallel fins 34 extending upwardly from a top face of the base 32. The fins 34 are spaced evenly from each other so that a plurality of parallel channels 36 are defined between the fins 34. A pair of protruded steps 38 are formed from opposite inner sides of two fins 34 located at two flanks of a middle one (hereafter middle fin 34) of the fins 34. A distance between each protruded step 38 and the middle fin 34 is less than that between the two neighboring fins 34.

Figure 2:
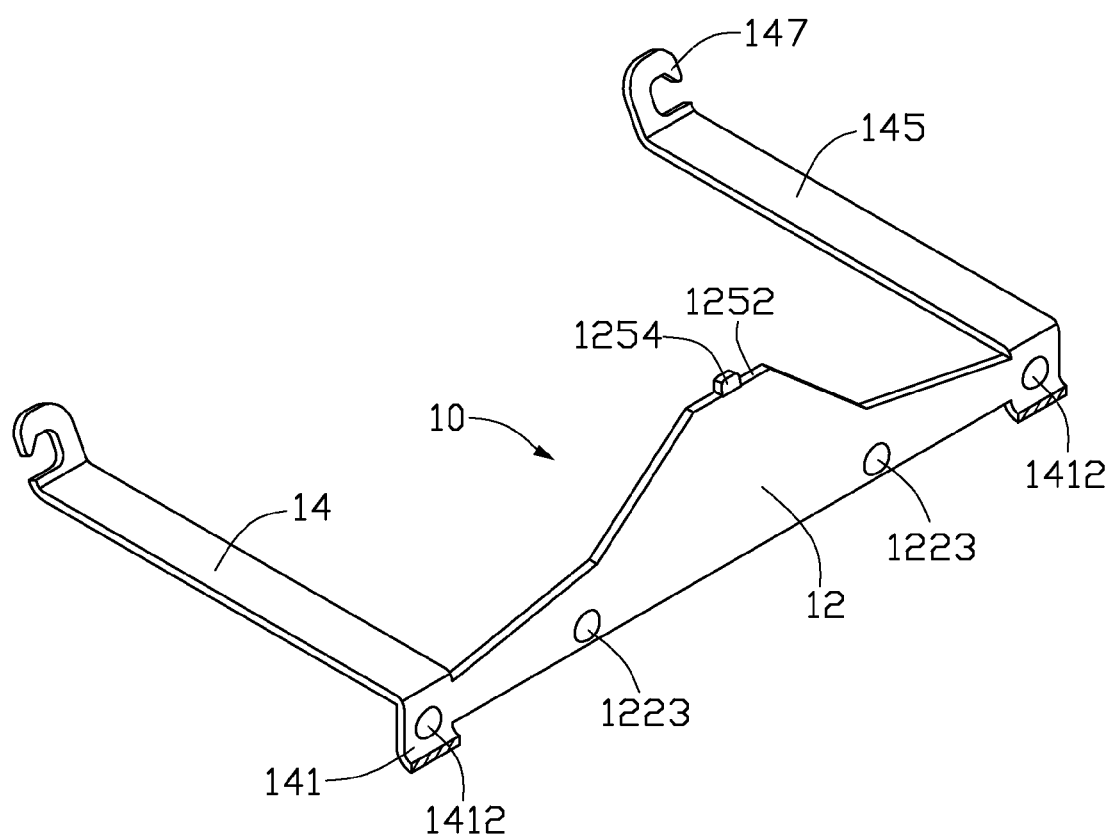
FIG. 2 is a cross sectional view of the clip of FIG. 1.

Referring to FIGS. 1-2, the clip 10 comprises a pressing member 12 through which the middle fin 34 extends when the clip 10 is assembled to the heat sink 30, and a pair of elongated arms 14 formed on opposite ends of the pressing member 12. The pressing member 12 comprises two parallel sheets (not labeled) connected with each other at two opposite top ends, and a through slot 121 is defined between the two sheets. The middle fin 34 extends through the slot 121 in a manner such that the two sheets are at two flanks of the middle fin 34 and abut against the protruded steps 38. Each sheet has an upper portion 122 and a lower portion 125 located below the upper portion 122. The lower portion 125 is located at a middle of each sheet and protrudes toward the base 32 of the heat sink 30. A pair of protruding points 1223 are protruded inwardly from the upper portion 122 of one of the two sheets and spaced from each other. A protruding point 1226 is formed inwardly on the other sheet and located at a middle of the other sheet and between the pair of protruding points 1223 of the one sheet along a length direction of the pressing member 12. The three protruding points 1223, 1226 are used for sandwiching the middle fin 34 therebetween. The protruding points 1223, 1226 engage with the middle fin 34 at three points of a triangle whereby the pressing member 12 can securely clamp the middle fin 34 when the clip 10 is mounted on the heat sink 30. The lower portion 125 has a flat bottom surface 1252, and a pair of protrusions 1254 is formed at the flat bottom surface 1252 for engaging with the base 32 of the heat sink 30. The elongated arms 14 comprise a pair of inversed U-shaped connecting portion 141 connecting the two sheets at the two opposite top ends of the sheets. A pair of flat extension portions 145 extends outwardly, oppositely and horizontally from free ends of each of the connecting portions 141. A pair of locking portions 147 is downwardly formed at free ends of the flat extensions portions 145. A pair of protruding points 1412 is protruded inwardly from each of the connecting portions 141. The flat extension portions 145 are coplanar. The locking portion 147 can be a hook or similar locking device, for engaging with a corresponding one of the clasps 52 of the printed circuit board 50.

Figure 3:
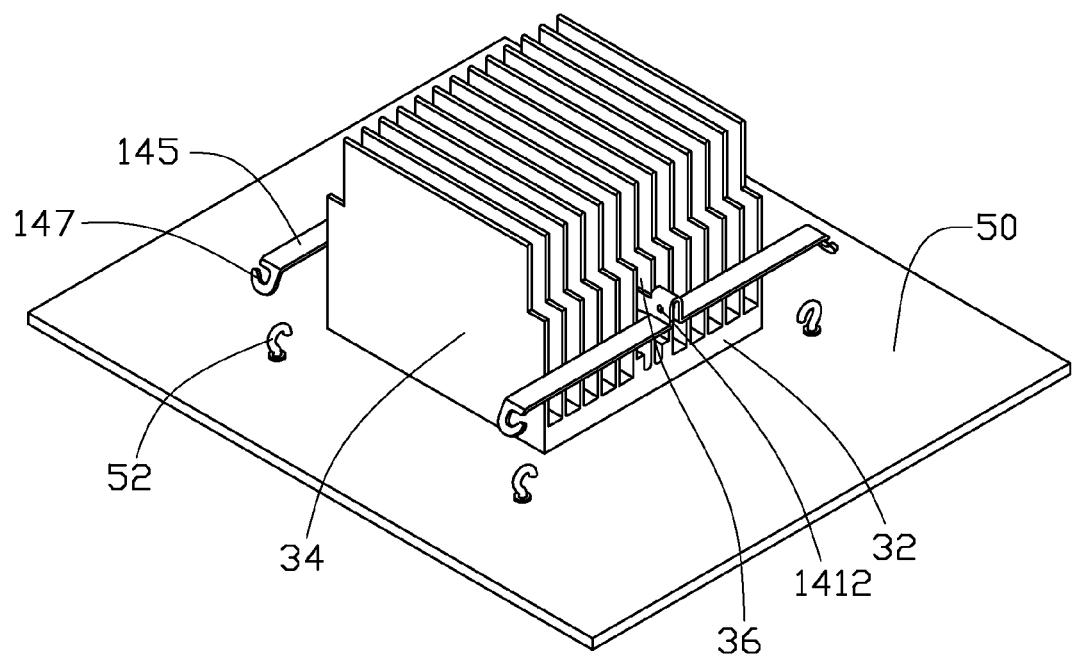
FIG. 3 is an assembled view of FIG. 1 with the clip in a released position.
Figure 4:
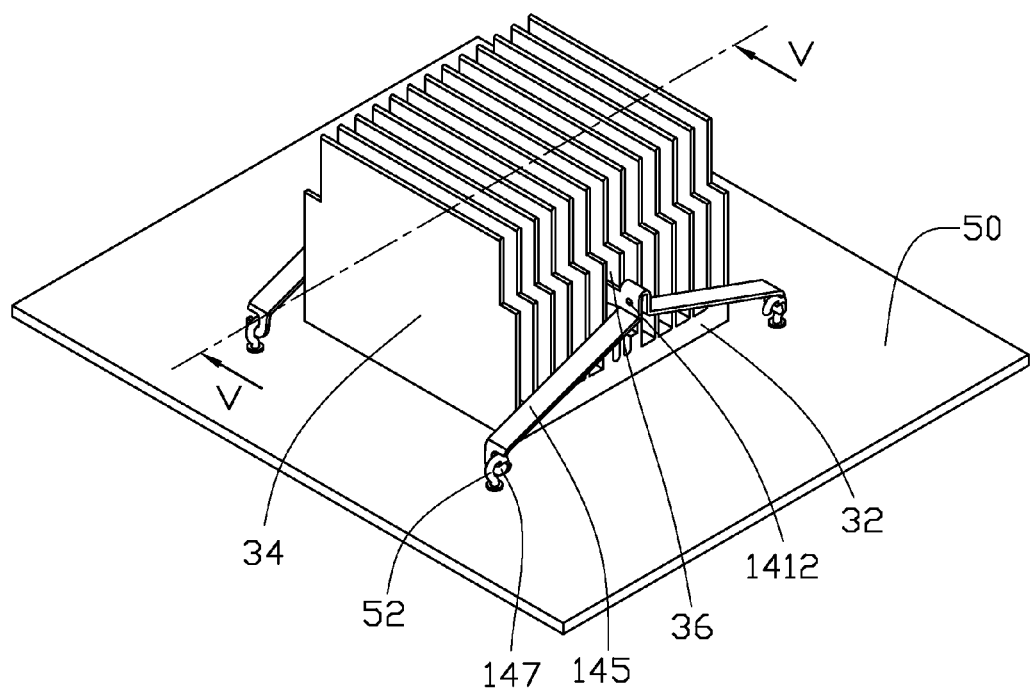
FIG. 4 is an assembled view of FIG. 1 with the clip in a locked position.
Figure 5:
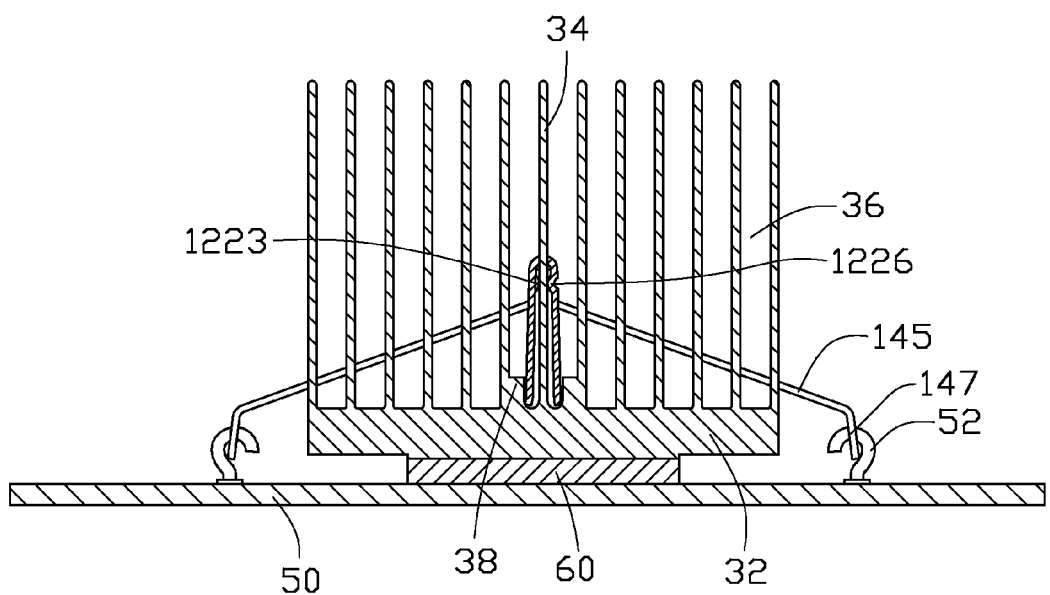
FIG. 5 is a cross sectional view of FIG. 4.

Referring to FIGS. 3-5, in assembly, the heat sink 30 is disposed on the electronic component 60. The two sheets of the pressing member 12 of the clip 10 move downwardly on two opposite faces of the middle fin 34 of the heat sink 30, while the elongated arms 14 move downwardly on two opposite outer sides of the heat sink 30. Particularly see FIG. 5, when the elongated arms 14 are pressed downwardly to cause the locking portions 147 to hook with the clasps 52, the clip 10 is elastically deformed in such a manner that the upper portions 122 of the sheets of the clip 10 move towards each other and the lower portions 125 move away from each other; outer sides of the lower portions 125 abut against inner sides of the two protruded steps 38 of the heat sink 30 for preventing the clip 10 from moving along a transverse direction along which the extension portions 145 extend. Simultaneously, the three protruding points 1223, 1226 of the upper portions 122 of the pressing member 12 abut against the middle fin 34 from the opposite faces thereof; therefore, the middle fin 34 is firmly sandwiched between the two sheets. The two pairs of protruding points 1412 of the connecting portions 141 abut against each other; the contacting protruding points 1412 can prevent the connecting portions 141 from being unduly deformed, thereby to enable the clip 10 to provide a stable clamping force for securing the heat sink 30 to the electronic component 60. The protrusions 1254 of the lower portions 125 of the pressing member 12 abut against the base 32 of the heat sink 30; the lower portions 125 of the pressing member 12 abut against the protruded steps 38 of the heat sink 30. The elongated arms 14 are pressed downwardly until the locking portions 147 of the arms 14 of the clip 10 resiliently engage with the clasps 52 of the printed circuit board 50. Thus the flat extension portions 145 have an obtuse angle therebetween, and a downward locking force is provided by the pressing member 12 of the clip 10 and the pair of protrusions 1254 of the lower portions 125 of the pressing member 12 to press downwardly on the heat sink 30 towards the electronic component 60, thus holding the heat sink 30 in intimate contact with the electronic component 60.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink assembly for dissipating heat generated by an electronic component mounted on a printed circuit board, the heat sink assembly comprising:
    a heat sink having a base and a plurality of fins extending from the base; and
    a clip mounted on the heat sink and adapted for securing the heat sink on the electronic component, the clip comprising:
        a pressing member and a pair of elongated arms formed on opposite ends of the pressing member, the pressing member having a lower portion protruding toward the base of the heat sink, a middle fin located on a center of the fins and extending through the pressing member in a manner such that the lower portion of the pressing member resiliently abuts against the heat sink, the two arms being located on opposite lateral sides of the heat sink and adapted for engaging with the printed circuit board so that the pressing member exerts a force on the heat sink toward the electronic component;
    wherein the pressing member comprises two parallel sheets connected with each other at two opposite top ends, and a through slot is defined between the two sheets, and the middle fin extends through the slot in a manner such that the two sheets are located at two flanks of the middle fin;
    wherein the arms comprise a pair of inversed U-shaped connecting portions connecting the two sheets at the two opposite top ends of the two sheets, and a pair of flat extension portions extending from free ends of each of the connecting portions; and
    wherein the flat extension portions of the arms are coplanar in their natural state, and the flat extension portions have an obtuse angle therebetween when the arms engage with clasps on the printed circuit board.

2. The heat sink assembly as claimed in claim 1, wherein the lower portion is formed on each of the sheets of the pressing member, the each of the sheets having a flat bottom surface at the lower portion, the lower portion forming a pair of protrusions at the flat bottom surfaces, respectively, for engaging with the base of the heat sink.

3. The heat sink assembly as claimed in claim 1, wherein a pair of protruding points are protruded inwardly from each of the connecting portions, the protruding points abut against each other when the arms engage with the printed circuit board.

4. The heat sink assembly as claimed in claim 1, wherein a plurality of protruding points are protruded inwardly from upper portions of the two sheets, the protruding points abutting against the middle fin when the arms of the clip engage with the printed circuit board.

5. The heat sink assembly as claimed in claim 1, wherein a pair of locking portions are downwardly formed at free ends of each of the arms for engaging with the clasps on the printed circuit board.

6. The heat sink assembly as claimed in claim 1, wherein a pair of protruded steps are formed from opposite inner sides of two fins located at two flanks of the middle fin, and the two sheets of the pressing member of the clip abut against the two protruded steps.

7. A clip adapted for mounting a heat sink on a printed circuit board comprising:
    a pressing member comprising two parallel sheets connected with each other at two opposite top ends of the pressing member, a through slot being defined between the two sheets, and a lower portion formed on a lower part of each of the sheets of the pressing member;
    a pair of elongated arms formed on the two opposite top ends of the pressing member, adapted for securing the pressing member together with the heat sink to the printed circuit board when the pressing member is attached to the heat sink and the elongated arms are bent downwardly;
    wherein the arms comprise a pair of inversed U-shaped connecting portions connecting the two sheets at the two opposite top ends of the pressing member, and a pair of flat extension portions extending from free ends of each of the connecting portions, and wherein the flat extension portions are coplanar in their natural state, and the flat extension portions have an obtuse angle therebetween when the arms engage with clasps on the printed circuit board to mount the heat sink on the printed circuit board.

8. The clip as claimed in claim 7, wherein the lower portion has a flat bottom surface, and a protrusion is formed at the flat bottom surface.

9. The clip as claimed in claim 8, wherein a plurality of protruding points are protruded inwardly from an upper portion of the two sheets.

10. The clip as claimed in claim 7, wherein the arms further comprise a pair of locking portions downwardly formed at free ends of the flat extensions.

11. The clip as claimed in claim 7, wherein a pair of protruding points is protruded inwardly from each of the connecting portions.

12. A heat sink assembly for dissipating heat generated by an electronic component mounted on a printed circuit board, the heat sink assembly comprising:

a heat sink having a base and a plurality of fins extending upwardly from the base; and a clip mounted on the heat sink and adapted for securing the heat sink on the electronic component, the clip comprising:

a pressing member and a pair of elongated, resilient arms formed on opposite ends of the pressing member, the pressing member having a lower portion protruding toward the base of the heat sink, one of the fins extending upwardly through the pressing member in a manner such that the lower portion of the pressing member resiliently abuts against the heat sink, the two arms being located on opposite lateral sides of the heat sink and adapted for being bent downwardly to resiliently engage with clasps on the printed circuit board, thereby to enable the pressing member to exert a force on the heat sink downwardly toward the electronic component;

wherein the arms comprise a pair of inversed U-shaped connecting portions connecting the pressing member at the two opposite top ends of the pressing member, and a pair of flat extension portions extending from free ends of each of the connecting portions; and wherein a pair of protruding points is protruded inwardly from each of the connecting portions, the protruding points abut against each other when the arms are bent downwardly to resiliently engage with the clasps on the printed circuit board.

* * * * *